United States Patent
Kim et al.

(10) Patent No.: US 8,241,820 B2
(45) Date of Patent: Aug. 14, 2012

(54) PHOTOMASK USED IN FABRICATION OF SEMICONDUCTOR DEVICE

(75) Inventors: Bong-Cheol Kim, Seoul (KR); Dae-Youp Lee, Gunpo-si (KR); Jae-Han Lee, Seoul (KR); Eun-Sung Kim, Seoul (KR); Byeong-Hwan Son, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 277 days.

(21) Appl. No.: 12/686,464

(22) Filed: Jan. 13, 2010

(65) Prior Publication Data

US 2010/0178599 A1 Jul. 15, 2010

(30) Foreign Application Priority Data

Jan. 15, 2009 (KR) .................. 10-2009-0003361

(51) Int. Cl.
*G03F 1/38* (2012.01)
*G03F 1/44* (2012.01)

(52) U.S. Cl. .......................................... 430/5

(58) Field of Classification Search ................ 430/5
See application file for complete search history.

(56) References Cited

U.S. PATENT DOCUMENTS

| 2006/0063075 A1* | 3/2006 | Park | 430/5 |
| 2006/0277521 A1* | 12/2006 | Chen et al. | 430/5 |
| 2009/0233184 A1* | 9/2009 | Moon | 430/5 |

FOREIGN PATENT DOCUMENTS

| KR | 1020050086296 A | 8/2005 |
| KR | 1020060000549 A | 1/2006 |
| KR | 1020070004341 A | 1/2007 |
| KR | 100741272 B1 | 7/2007 |
| KR | 100755074 B1 | 8/2007 |
| KR | 1020080001441 A | 1/2008 |

* cited by examiner

*Primary Examiner* — Mark F Huff
*Assistant Examiner* — John S Ruggles
(74) *Attorney, Agent, or Firm* — Myers Bigel Sibley & Sajovec, P.A.

(57) ABSTRACT

Provided is a photomask used in fabrication of a semiconductor device. The photomask includes first and second regions to be transferred onto a semiconductor substrate having a step difference. The first and second regions have mask patterns. The mask patterns of the first region have a different shape from the mask patterns of the second region. The mask patterns of the second region have concave and convex portions disposed in opposite lateral portions thereof.

11 Claims, 7 Drawing Sheets

PHOTOMASK USED IN FABRICATION OF SEMICONDUCTOR DEVICE

CROSS-REFERENCE TO RELATED APPLICATION

This application claims the benefit of priority under 35 U.S.C. §119 from Korean Patent Application No. 10-2009-0003361 filed on Jan. 15, 2009, the contents of which are hereby incorporated herein by reference in its entirety.

BACKGROUND

1. Field

Example embodiments relate generally to semiconductor devices and, more particularly, to the fabrication of semiconductor devices.

2. Description of Related Art

In general, fabrication of a semiconductor device involves performing a photolithography process on a semiconductor substrate to form a structure on the semiconductor substrate. Specifically, the semiconductor substrate may have a material layer and a photoresist layer stacked thereon. The photolithography process may be performed by mounting the semiconductor substrate in a projection exposure system. The projection exposure system may include a light source, a condenser lens, a photomask, and a projection lens, which are sequentially disposed along a light path.

In the case where a photomask includes a lot of mask patterns extending in one direction, the projection exposure system may be used by interposing a dipole illumination system between the light source and the condenser lens. The dipole illumination system may allow light from the light source to be obliquely incident to the condenser lens, thereby contributing to limiting primary light diffracted by the photomask to the projection lens. Thus, the projection exposure system may properly transfer the mask patterns onto the photoresist layer using the dipole illumination system.

However, when a semiconductor substrate has a step difference, the projection exposure system may not be able to obtain good aerial images of the mask patterns of the photomask on the photoresist layer even with use of the dipole illumination system. This is because the photoresist layer has a top surface with different levels corresponding to upper and lower steps of the semiconductor substrate. In other words, the projection exposure system may have good depths of focus (DOFs) with respect to the mask patterns in only a portion of the photoresist layer corresponding to the upper step or the lower step of the semiconductor substrate.

SUMMARY

Example embodiments provide a photomask used for properly transferring mask patterns onto a photoresist layer under a dipole illumination system of a projection exposure system even if a semiconductor substrate has a step difference.

According to example embodiments, a photomask may include first and second mask patterns. The photomask may be transferred using a dipole illumination system onto a semiconductor substrate having upper and lower steps disposed at different heights. The first and second mask patterns may be disposed adjacent to each other on the photomask. The first and second mask patterns may have first and second concave and convex portions, which may be repetitively and alternately disposed in opposite lateral portions of the first and second mask patterns. The first and second concave and convex portions may be bent at right angles to an extension line that connects centers of openings of the dipole illumination system and disposed under the dipole illumination system. Also, the first and second mask patterns may correspond to the lower step of the semiconductor substrate.

According to some embodiments, one selected from the first concave and convex portions may correspond to a portion of the second concave and convex portions.

According to some embodiments, the first and second mask patterns may have the second and first concave and convex portions disposed on opposite sides of the opposite lateral portions of the first and second mask patterns.

According to some embodiments, the photomask may further include at least one third mask pattern corresponding to the upper step of the semiconductor substrate. Each of the first and second mask patterns is disposed at least one on the photomask. The third mask pattern may have a different shape from the first and second mask patterns.

According to the remaining example embodiments, the first concave and convex portions may correspond to the second convex and concave portions, respectively.

According to the remaining example embodiments, the first and second mask patterns may have the second and first concave and convex portions disposed on opposite sides of the opposite lateral portions of the first and second mask patterns.

According to the remaining example embodiments, the photomask may further include at least one third mask pattern corresponding to the upper step of the semiconductor substrate. The third mask pattern may have a different shape from the first and second mask patterns.

According to other example embodiments, a photomask may include first and second mask patterns. The photomask may be transferred using a dipole illumination system onto a semiconductor substrate having upper and lower steps disposed at different heights. The first and second mask patterns may be disposed on the photomask. The first and second mask patterns may have first and second concave and convex portions. The first and second concave and convex portions may be repetitively and alternately bent at right angles to an extension line connecting centers of openings of the dipole illumination system and disposed under the dipole illumination system. Each of the first and second mask patterns may be disposed such that at least one corresponds to the lower step of the semiconductor substrate. The first concave and convex portions may be repetitively and alternately disposed in both lateral portions of the first mask pattern. The second concave and convex portions may be repetitively and alternately disposed in both lateral portions of the second mask pattern.

According to some embodiments, one selected from the first concave and convex portions may correspond to a portion of the second concave and convex portions.

According to the remaining example embodiments, the first concave and convex portions may correspond to the second convex and concave portions, respectively.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EMBODIMENTS

Various example embodiments will now be described more fully with reference to the accompanying drawings in which some example embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. It will be understood that, although terms "mask", "substrate". "pattern", "concave and convex portions" and the like, may be used herein to describe various elements, components, regions, layers and/or sections, these elements, components, regions, layers and/or sections should not be limited by these terms. These terms are only used to distinguish one element, component, region, layer or section from another region, layer or section.

As used herein, the term "at least one (or two)" includes any and all combinations of one or more of the associated listed items. Spatially relative terms, such as "selected". "special", "specific" "under". "other", "peripheral". "on" and the like, may be used herein for ease of description to describe one element or feature's relationship to another element(s) or feature(s) as illustrated in the figures. The terminology used herein is for the purpose of describing particular embodiments only and is not intended to be limiting of the invention.

In the drawings, the sizes and relative sizes of layers and regions may be exaggerated for clarity.

It will be understood that when an element or layer is referred to as being "on," "connected to," "coupled to" or "responsive to" another element or layer, it can be directly on, connected, coupled or responsive to the other element or layer or intervening elements or layers may be present. In contrast, when an element is referred to as being "directly on," "directly connected to," "directly coupled to" or "directly responsive to" another element or layer, there are no intervening elements or layers present. Like numbers refer to like elements throughout. As used herein, the term "and/or" includes any and all combinations (mixtures) of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The structure and/or the device may be otherwise oriented (rotated 90 degrees or at other orientations) and the spatially relative descriptors used herein interpreted accordingly.

The terminology used herein is for the purpose of describing, particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

It should also be noted that in some alternate implementations, the functionality of a given block may be separated into multiple blocks and/or the functionality of two or more blocks may be at least partially integrated.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Hereinafter, a photomask according to example embodiments will be described in more detail with reference to FIGS. 1 and 2.

Figure 1:
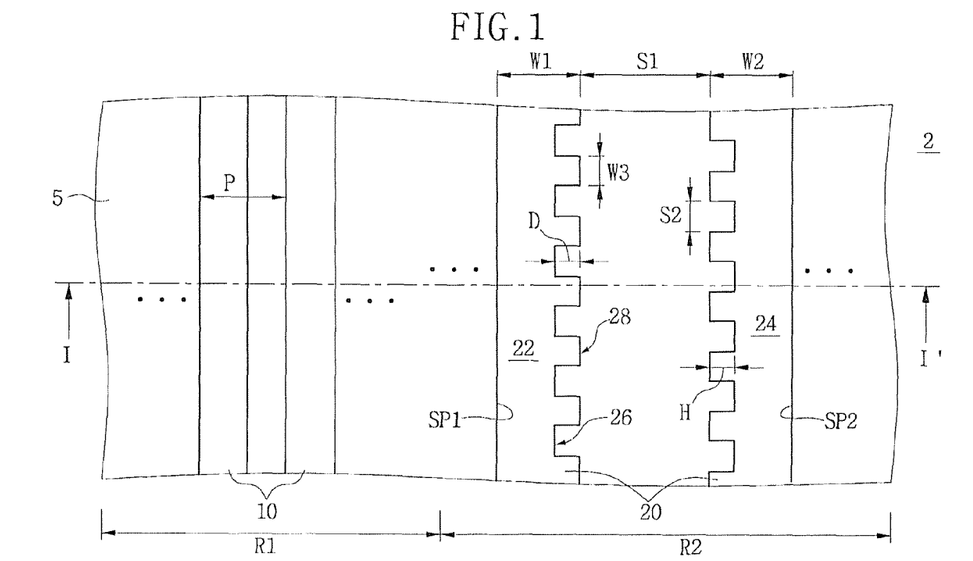
FIG. 1 is a plan view showing a photomask according to example embodiments.

FIG. 1 is a plan view showing a photomask according to example embodiments. FIG. 2 is a cross-sectional view showing a photomask taken along line I-I' of FIG. 1.

Referring to FIG. 1, a photomask 2 according to example embodiments may include a mask substrate 5 having first and second regions R1 and R2. The first and second regions R1 and R2 of the mask substrate 5 may respectively correspond to different levels of a step difference in a semiconductor substrate. The first region R1 may have first mask patterns 10. The first mask patterns 10 may have the same pitch P1 or different pitches, and may be parallel to one another.

The first mask patterns 10 may have lateral portions corresponding to a substantially single straight line. The second regions R2 may have second mask patterns 20. The second mask patterns 20 may be disposed parallel to one another. The second mask patterns 20 may have the same width W1 or different widths W1 and W2. The second mask patterns 20 may be spaced apart from one another at the same interval S1 or different intervals.

A selected mask pattern 22 and a special mask pattern 24 disposed adjacent to the selected mask pattern 22 may be selected from the second mask patterns 20. The selected mask pattern 22 and the special mask pattern 24 may have first and second concave and convex portions 26 and 28 formed in opposite lateral portions from left to right. The first and second concave portions 26 may extend to a predetermined depth D from the opposite lateral portions of the selected mask pattern 22 and the special mask pattern 24 toward the insides thereof.

The first and second concave portions 26 may be formed at the same interval S2 or different intervals. Each of the first and second convex portions 28 protrudes to a predetermined height H, as shown in FIG. 1 The first and second convex portions 28 may have the same width W3 or different widths. Structures of the selected mask pattern 22 and the special mask pattern 24 will now be described in more detail.

The first concave and convex portions 26 and 28 may be disposed in crossing (or alternating) one another with respect to the second concave and convex portions 26 and 28. In this case, the first concave portion 26 or the first convex portion 28 may correspond to a portion of the second concave portion 26 or the second convex portion 28. The first concave portion 26 and the first convex portion 28 may also correspond to the second convex portion 28 and the second concave portion 26, respectively. The second and first concave and convex portions 26 and 28 may be disposed in an orderly shape on opposite sides SP1 and SP2 of the opposite lateral portions of the selected mask pattern 22 and the special mask pattern 24.

Alternatively, the first concave and convex portions 26 and 28 may be disposed on both lateral portions of the selected mask pattern 22. The second concave and convex portions 26 and 28 may be disposed on both lateral portions of the special mask pattern 24. In this case, one selected from the first concave portion 26 and the first convex portion 28 may correspond to a portion of the second concave portion 26 and the second convex portion 28. The first concave portion 26 and the first convex portion 28 may also correspond to the second convex portion 28 and the second concave portion 26, respectively.

Figure 2:
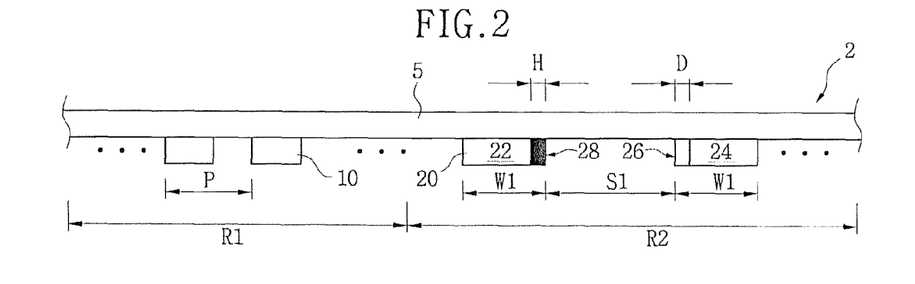
FIG. 2 is a cross-sectional view showing a photomask taken along line I-I' of FIG. 1.

Referring to FIG. 2, a photomask 2 according to example embodiments may include first and second mask patterns 10 and 20 disposed on a first surface of a mask substrate 5. The first and second mask patterns 10 and 20 may correspond to a selected structure of a semiconductor device. The first mask patterns 10 may be disposed to protrude from a first region R1 of the mask substrate 5. The first mask patterns 10 may have the same pitch P.

The second mask patterns 20 may be disposed to protrude from a second region R2 of the mask substrate 5. The second mask patterns 20 may have the same pitch W1+S1. A selected mask pattern 22 and a special mask pattern 24 of the second mask patterns 20 may have a first convex portion 28 and a second concave portion 26 disposed in opposite lateral portions thereof. The first convex portion 28 and the second concave portion 26 may have a predetermined height H and a predetermined depth D, respectively, to make the opposite lateral portions bent.

Hereinafter, a method of applying a photomask according to example embodiments will be described with reference to FIGS. 3 through 10.

Figure 3:
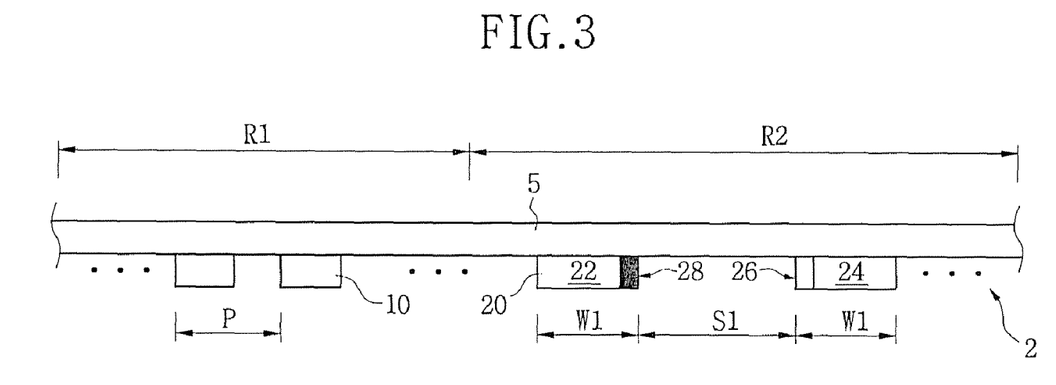
FIGS. 3 and 4 are cross-sectional views illustrating a method of applying a photomask of FIG. 1 to a semiconductor substrate.
Figure 4:
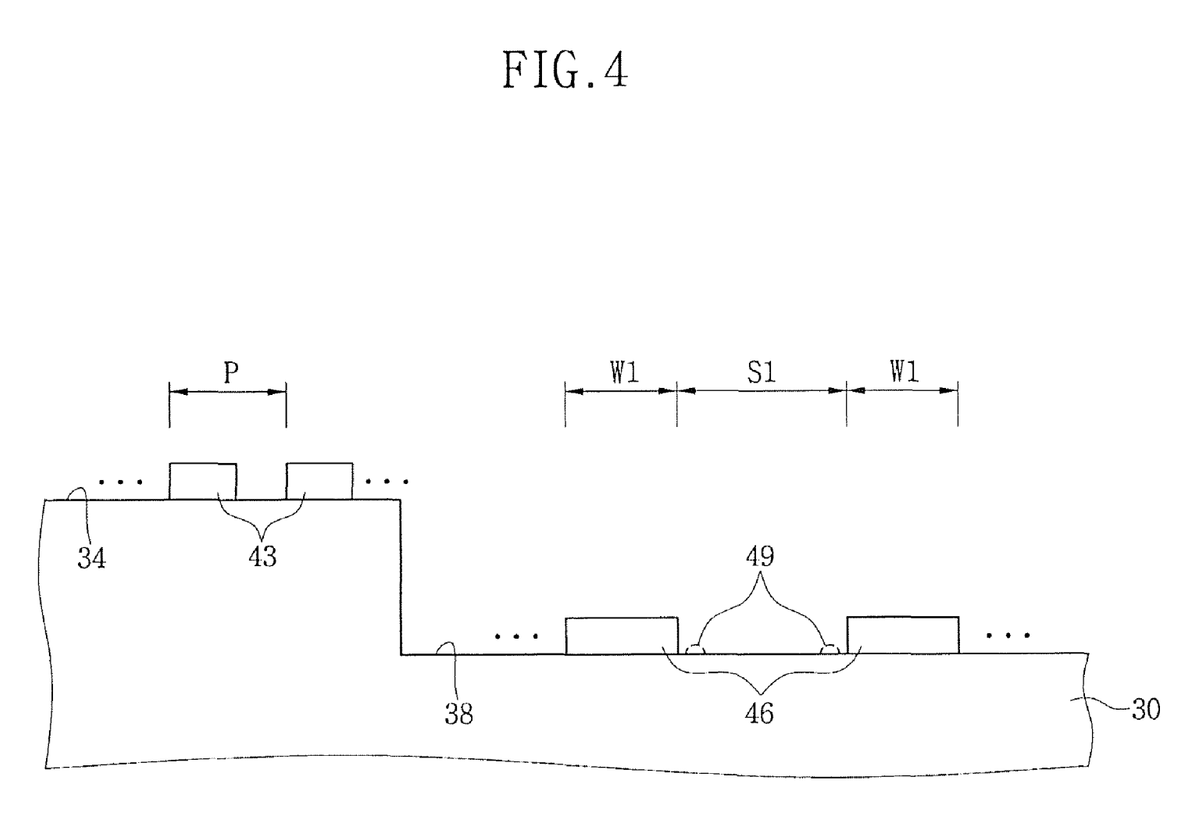
Figure 5:
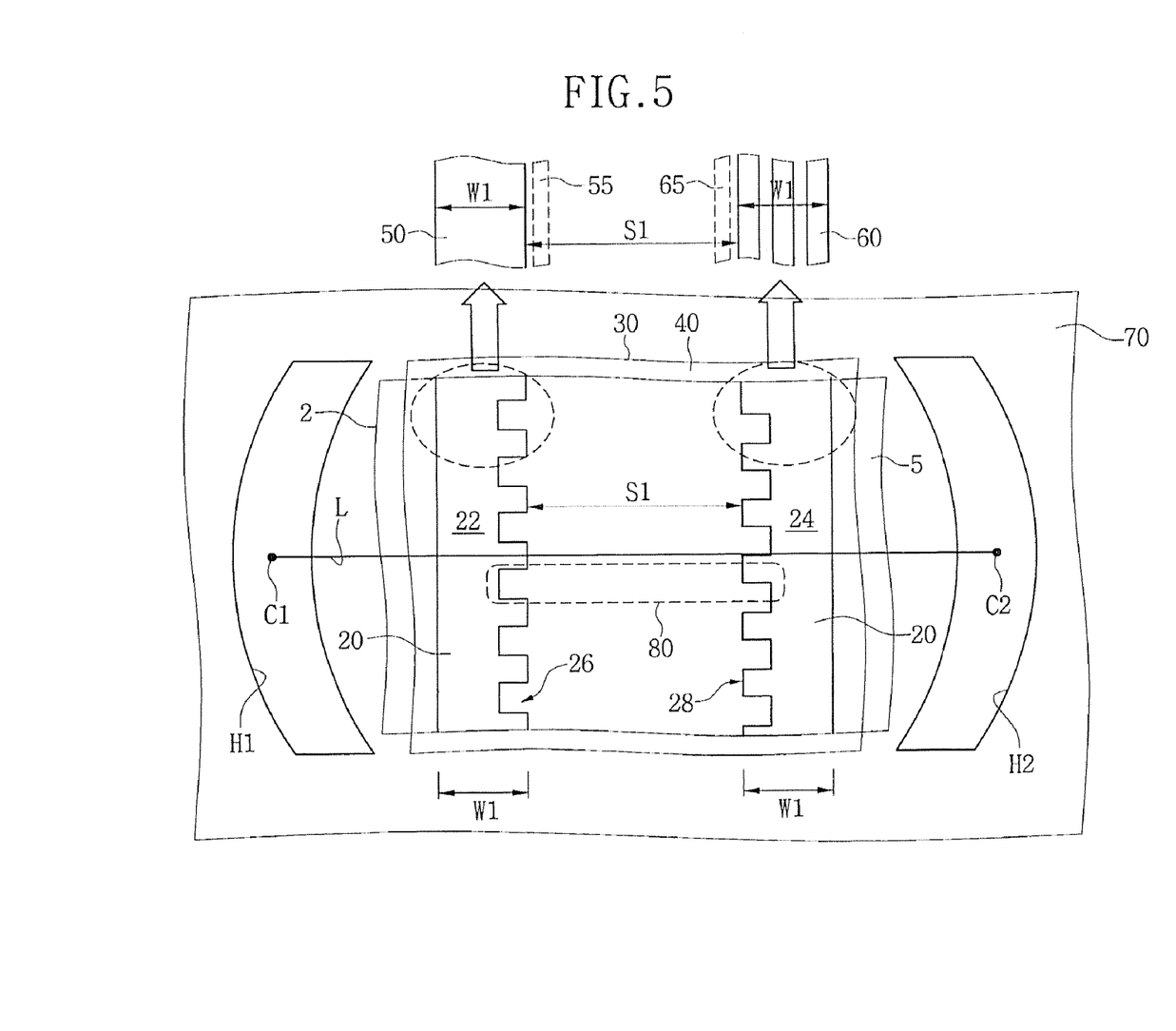
FIG. 5 is a plan view illustrating the location relationship between a photomask and a semiconductor substrate of FIG. 3 and a dipole illumination system.

FIGS. 3 and 4 are cross-sectional views illustrating, a method of applying a photomask of FIG. 1 to a semiconductor substrate. FIG. 5 is a plan view illustrating the location relationship between a photomask and a semiconductor substrate of FIG. 3 and a dipole illumination system.

Figure 6:
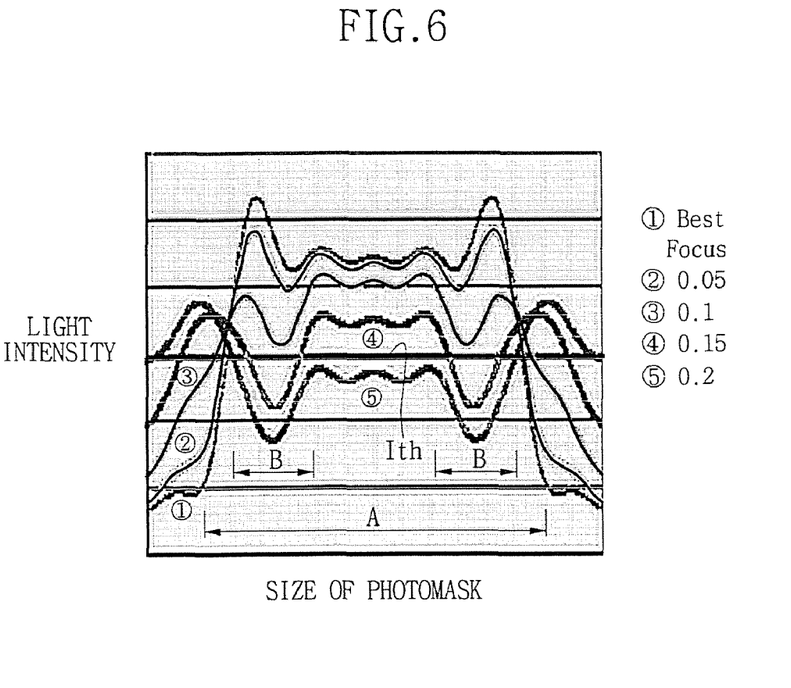
FIGS. 6 through 8 are graphs showing aerial images formed on a semiconductor substrate according, to a shape of mask patterns formed in a photomask based on a location relationship of FIG. 5.
Figure 7:
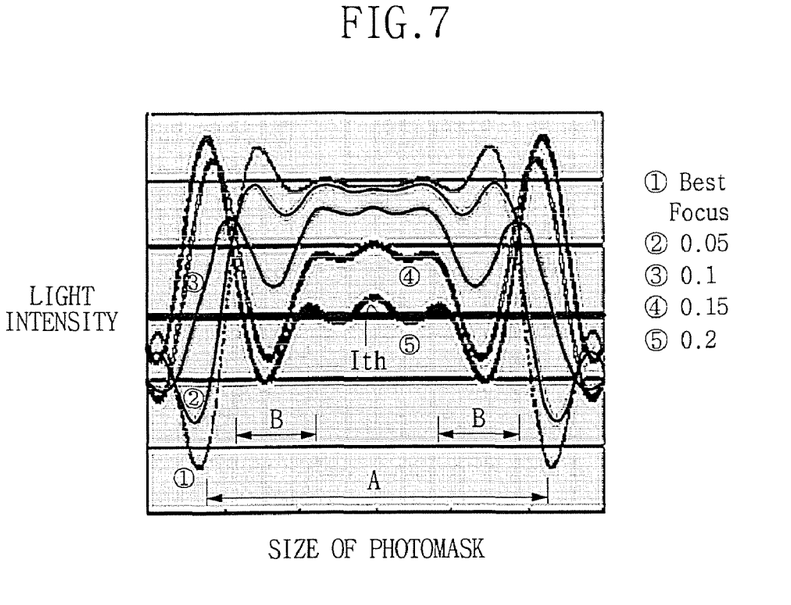
Figure 8:
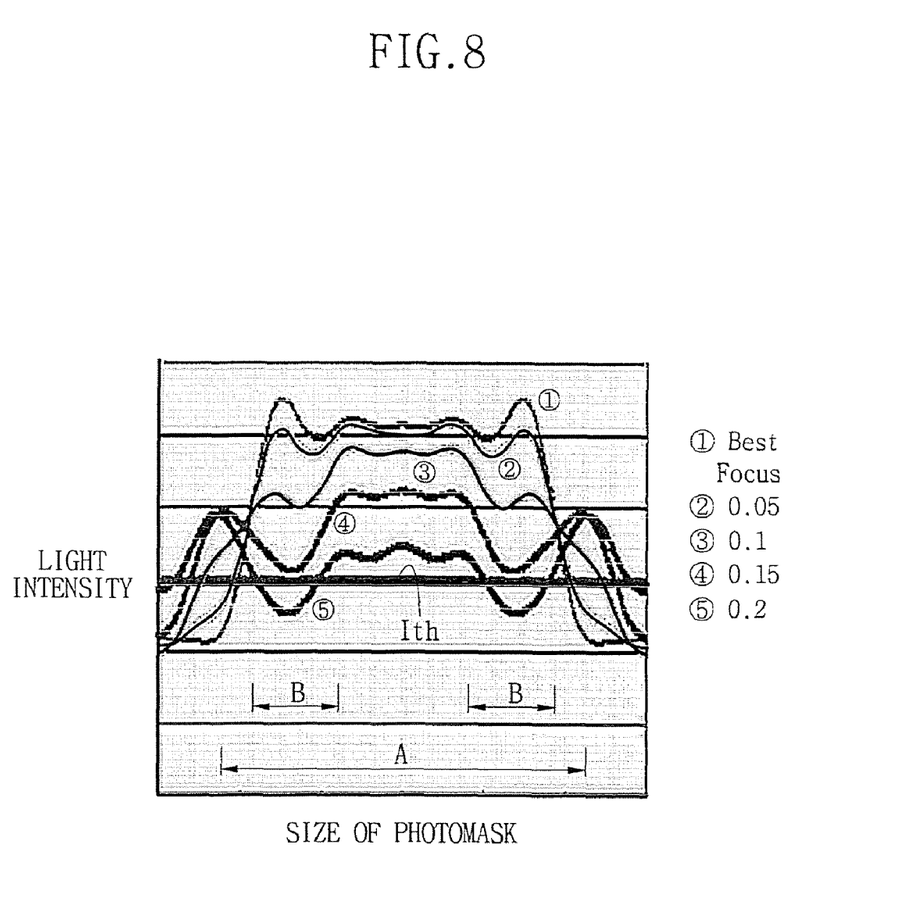
Figure 9:
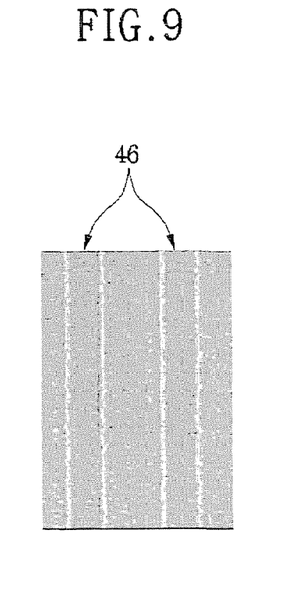
FIGS. 9 and 10 are photographs showing photoresist patterns formed on a semiconductor substrate using a method shown in FIGS. 3 and 4.
Figure 10:
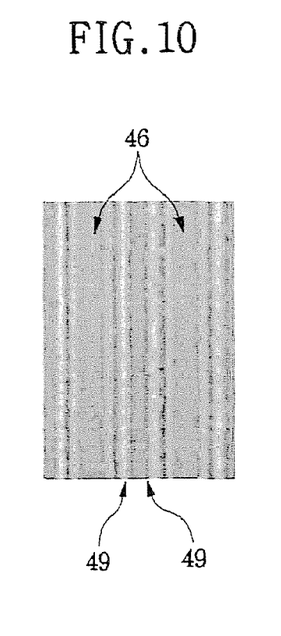

FIGS. 6 through 8 are graphs showing, aerial images formed on a semiconductor substrate according to a shape of mask patterns formed in a photomask based on a location relationship of FIG. 5. FIGS. 9 and 10 are photographs showing photoresist patterns formed on a semiconductor substrate using a method shown in FIGS. 3 and 4.

Referring to FIG. 3, a photomask 2 and a semiconductor substrate 30 may be prepared according to example embodiments. The photomask 2 may be used in fabrication of a semiconductor device. To this end, the photomask 2 may have first and second regions R1 and R2 to divide a mask substrate 5. The first region R1 may have first mask patterns 10 having the same pitch P. The second regions R2 may have second mask patterns 20 having the same pitch W1+S1. Each of the second mask patterns 20 may have concave and convex portions 26 and 28 formed repetitively in opposite lateral portions thereof.

The concave and convex portions 26 and 28 may be formed in the second mask patterns 20 as described above in detail with reference to FIG. 1. Meanwhile, the semiconductor substrate 30 may have a step difference. The semiconductor substrate 30 may have upper and lower steps 34 and 38 disposed at different levels, as illustrated in FIG. 3. A photoresist layer 40 may be conformably formed on the upper and lower steps 34 and 38 of the semiconductor substrate 30. Thereafter, the photomask 2 and the semiconductor substrate 30 may be loaded on a projection exposure system (not shown).

The projection exposure system may include a light source, a dipole illumination system, a condenser lens, a projection lens, and a loading chuck, as would be understood by one skilled in the art. The photomask 2 may be mounted on the projection exposure system to be interposed between the condenser lens and the projection lens. The semiconductor substrate 30 may be mounted on the loading chuck to be interposed between the projection lens and the loading chuck. In this case, the upper and lower steps 34 and 38 of the semiconductor substrate 30 may be aligned to respectively correspond to the first and second regions R1 and R2 of the photomask 2.

Referring to FIG. 5, the projection exposure system may have the first and second mask patterns 10 and 20 of the photomask 2 of FIG. 3 between openings H1 and H2 of a dipole illumination system 70. In this case, the first mask patterns 10 may be omitted from FIG. 5 to simplify the contents of FIG. 3. The dipole illumination system 70 may be used in case that lots of first and second mask patterns 10 and 20 are disposed to extend in one direction on the mask substrate 5. In this case, the dipole illumination system 70 may allow light from the light source to be obliquely incident in a direction different from the one direction so that the first and second mask patterns 10 and 20 can be effectively transferred onto the photoresist layer 40 of FIG. 3.

However, the projection exposure system may have different process environments with respect to the tipper and lower steps 34 and 38 due to the step difference of the semiconductor substrate 30 of FIG. 3. For example, the projection exposure system may have a good focus value to transfer the first mask patterns 10 onto the upper step 34 of the semiconductor substrate 30 of FIG. 3. Conversely, the projection exposure system may have a defocus value to transfer the second mask patterns 20 onto the lower step 38 of the semiconductor substrate 30 of FIG. 3. In addition, the projection exposure system may have focus and defocus values contrary to the above description and transfer the first and second mask patterns 10 and 20 onto the semiconductor substrate 30.

Meanwhile, in order to further describe the photomask 2 according to example embodiments against the conventional art, light intensity in an aerial image formed on the semiconductor substrate 30 was simulated using a combination of the projection exposure system and the photomask 2. To this end, assuming that the projection exposure system has a good focus value with respect to the first mask patterns 10 to be transferred onto the upper step 34 of the semiconductor substrate 30, this simulation led to finding a method of effectively transferring the second mask patterns 20 on the lower step 38 of the semiconductor substrate 30.

Continuously, it was assumed that only the selected mask pattern 22 and the special mask pattern 24 of the second mask patterns 20 of the photomask 2 were exposed under the dipole illumination system 70. It was assumed that the semiconductor substrate 30 did not include the photoresist layer 40 of FIG. 3. Also, it was assumed that the photomask 2 and the semiconductor substrate 30 were loaded on the projection exposure system. Under the above assumptions, the simulation was conducted using a simulation tool called 'Solid-E' (available from 'Synopsys').

During, the conduction of the simulation, the simulation tool may allow light from a light source to be obliquely incident to the photomask 2 through the dipole illumination system 70. The selected mask pattern 22 and the special mask pattern 24 may have geometrical shapes described with reference to FIG. 1. For brevity, it is exemplarily illustrated that the selected mask pattern 22 and the special mask pattern 24 may have the first and second concave and convex portions 26 and 28 formed in crossing (or alternating) one another only in the opposite lateral portions thereof.

In this case, the first and second concave and convex portions 26 and 28 may be bent at right angles to an extension line L that connects centers C1 and C2 of the openings H1 and H2 of the dipole illumination system 70. In another case, the first and second concave and convex portions 26 and 28 may not be disposed in the second mask patterns 20. To do this, the second mask patterns 20 may have specific mask patterns 50 or 60 other than the selected mask pattern 22 and the special mask pattern 24.

Each of the specific mask patterns 50 may have the same pitch W1+S1 as the selected mask pattern 22 and the special mask pattern 24 and may not have any concave and convex portions. Also, each of the specific mask patterns 60 may have the same pitch W1+S1 as the selected mask pattern 22 and the special mask pattern 24 and be divided into sub-patterns. The sub-patterns may alternate with spaces disposed at right angles to the extension line L that connects the centers C1 and C2 of the openings H1 and H2 of the dipole illumination system 70.

Referring to FIG. 6, simulation results ① to ⑤ according to focus values were obtained using the simulation tool. The focus values are a best focus value (0.0) and numerical values (0.05, 0.1, 0.15, and 0.2) obtained by varying the best focus value (0.0) at a regular interval of Δ0.05. In FIG. 6, an abscissa denotes the size of the photomask 2 measured along the extension line L that passes the centers C1 and C2 of the openings H1 and H2 of the dipole illumination system 70.

In this case, the size of the photomask 2 may correspond to a distance between arbitrary points in adjacent second mask patterns 20. Also, no concave and convex portions may be formed in the opposite lateral portions of the second mask patterns 20. Thus, the second mask patterns 20 may be the specific mask patterns 50 of FIG. 5. In the abscissa of FIG. 6, the simulation results ① to ⑤ may be differentiated from one another using reference characters A and B. Reference character A may correspond to a desired distance between two adjacent specific mask patterns 50.

The size of the photomask 2 adjacent to reference character A may correspond to a distance between lateral portions of the two adjacent specific mask patterns 50 and the arbitrary points in the two adjacent specific mask patterns 50. In FIG. 6, an ordinate denotes the light intensity in the aerial image formed between the two adjacent specific mask patterns 50. It was assumed that the light intensity has a threshold intensity Ith that allows the projection exposure system to maintain the best focus value with respect to the first mask patterns 10 in the first region R1 of the photomask 2. In this case, the light intensity varied with the focus value with respect to the specific mask patterns 50 in the second region R2.

In the graph of FIG. 6, the light intensities of the simulation results ① to ③ may be higher in reference character A of the second region R2 than the threshold intensity Ith of the first region R1 of the photomask 2 on the semiconductor substrate 30. Despite the step difference of the semiconductor substrate 30, due to the light intensities of the simulation results ① to ③, the first and second mask patterns 10 and 20 of the first and second regions R1 and R2 may be changed into good aerial images on the semiconductor substrate 30.

It can be expected from the good aerial images that even if the semiconductor substrate 30 is replaced by the photoresist layer 40, the same results may be obtained. This is because the good aerial images may be formed on the surface of the photoresist layer 40. Due to the good aerial image, second photoresist patterns 46 shown in FIG. 4 or 9 may be formed on the semiconductor substrate 30. In contrast, light intensities of the simulation results ④ and ⑤ may be lower in reference character A of the second region R2 than the threshold intensity Ith of the first region R1 of the photomask 2 on the semiconductor substrate 30.

In addition, the light intensities of the simulation results ④ and ⑤ may be lower in reference character B than in reference character A. Due to the light intensities of the simulation results ④ and ⑤, bad aerial images may be formed in reference character A on the semiconductor substrate 30. The bad aerial images may include desired images, and undesired images 55 of FIG. 5.

The desired image may separate two adjacent specific mask patterns 50. Also, the undesired image 55 may be formed adjacent to the lateral portions of the two adjacent specific mask patterns 50. Thus, the bad aerial images cannot overcome the step difference of the semiconductor substrate 30 so that the second photoresist patterns 46 and photoresist parasitic patterns 49 of FIG. 4 or 10 may be formed on the semiconductor substrate 30. Each of the photoresist parasitic patterns 49 may correspond to the undesired image 55.

Referring to FIG. 7, similar to FIG. 6, simulation results ① to ⑤ according to focus values were obtained using the simulation tool. The focus values are a best focus value (0.0) and numerical values (0.05, 0.1, 0.15, and 0.2) obtained by varying the best focus value (0.0) at a regular interval of Δ0.05. In FIG. 7, an abscissa and an ordinate are the same as in FIG. 6. Also, a threshold intensity Ith of the first region R1 of the photomask 2 and reference characters A and B of the second region R2 are the same as in FIG. 6.

The photomask 2 may not have concave and convex portions in opposite lateral portions of the second mask patterns 20. In this case, the second mask patterns 20 may be the specific mask patterns 60 of FIG. 6. Each of the specific mask patterns 60 may be divided into sub-patterns. Referring to the graph of FIG. 7, the light intensities of the simulation results ① to ③ may be higher in reference character A of the second region R2 than the threshold intensity Ith of the first region R1 of the photomask 2 on the semiconductor substrate 30.

Despite the step difference of the semiconductor substrate 30, due to the light intensities of the simulation results ① to ③, the first and second mask patterns 10 and 20 of the first and second regions R1 and R2 may be changed into good aerial images on the semiconductor substrate 30. Due to the good aerial image, the second photoresist patterns 46 shown in FIG. 4 or 9 may be formed on the semiconductor substrate 30. In contrast, light intensities of the simulation results ④ and ⑤ may be lower in reference character B of the second region R2 than the threshold intensity Ith of the first region R1 of the photomask 2 on the semiconductor substrate 30.

As a result, the light intensities of the simulation results ④ and ⑤ may lead to formation of bad aerial images in reference character A on the semiconductor substrate 30 in the same manner as in FIG. 6. The bad aerial images may include desired images and undesired images 65 of FIG. 5. Thus, the bad aerial images cannot overcome the step difference of the semiconductor substrate 30 so that the second photoresist patterns 46 and photoresist parasitic patterns 49 of FIG. 4 or 10 may be formed on the semiconductor substrate 30. Each of the photoresist parasitic patterns 49 may correspond to the undesired image 65.

Referring to FIG. 8, unlike in FIG. 6, simulation results ① to ⑤ according to focus values were obtained using the simulation tool. The focus values are the same numerical values as in FIG. 6. In FIG. 8, an abscissa and an ordinate are the same as in FIG. 6. Also, a threshold intensity Ith of the first region R1 of the photomask 2 and reference characters A and B of the second region R2 are the same as in FIG. 6.

The photomask 2 may have concave and convex portions 26 and 28 repetitively formed in opposite lateral portions of the second mask patterns 20. In this case, the second mask patterns 20 may be the selected mask pattern 22 and the special mask pattern 24 of FIG. 5. Referring to the graph of FIG. 8, a light intensity of the simulation result ⑤ may be lower in reference character B of the second region R2 than the threshold intensity Ith of the first region R1 of the photomask 2 on the semiconductor substrate 30. Due to the light intensity of the simulation result ⑤, a bad aerial image may be formed in the reference character A on the semiconductor substrate 30.

However, the light intensity of the simulation result ⑤ is higher in the reference character A than the light intensities of the simulation results ④ and ⑤ of FIG. 6 or 7. This is because a unit exposure region 80 of FIG. 5 has a larger area in the selected mask pattern 22 and the special mask pattern 24 than in the specific mask patterns 50 or 60 of FIG. 6 or 7. The area of the unit exposure region 80 in the selected mask pattern 22 and the special mask pattern 24 may be increased due to the concave and convex portions 26 and 28.

The selected mask pattern 22 and the special mask pattern 24 may increase a depth of focus (DOF). In this case, referring to the simulation result ⑤, it can be expected that a good aerial image may be formed in reference character A by adjusting an environment of a photolithography process, in addition to the step difference of the semiconductor substrate 30. The light intensities of the simulation results ① to ④ may be higher in reference character A of the second region R2 than the threshold intensity Ith of the first region R1 of the photomask 2 on the semiconductor substrate 30.

Despite the step difference of the semiconductor substrate 30, due to the light intensities of the simulation results ① to ④, the first and second mask patterns 10 and 20 of the first and second regions R1 and R2 may be changed into good aerial images on the semiconductor substrate 30. Due to the good aerial image, the second photoresist patterns 46 shown in FIG. 4 or 9 may be formed on the semiconductor substrate 30. As a result, the photomask 20 having the selected mask pattern 22 and the special mask pattern 24 may increase a DOF in a photolithography process in response to the step difference of the semiconductor substrate 30.

Referring to FIG. 4, the projection exposure system of FIG. 3 may transfer the first and second mask patterns 10 and 20 of the photomask 2 onto the photoresist layer 40 during an exposure step of a photolithography process. The photomask 2 may have the first mask patterns 10 in the first region R1 and the second mask patterns 20 in the second region R2. The second mask patterns 20 may include the selected mask patterns 22 and the special mask patterns 24, which may be disposed repetitively and alternately in the second region R2.

Each of the second mask patterns 20 may include the specific mask pattern 50 or 60 of FIG. 5. In this case, the projection exposure system may allow light from the light source to pass through the dipole illumination system 70, the condenser lens, the photomask 2, and the projection lens, thereby forming the aerial images of FIG. 6, 7, or 8 on the photoresist layer 40. After performing the exposure step, the photoresist layer 40 may be transformed into first and second photoresist patterns 43 and 46 and/or photoresist parasitic patterns 49 through subsequent processes including a developing process.

The first photoresist patterns 43 may be formed on the upper step 34 of the semiconductor substrate 30 corresponding to the first mask patterns 10 of the photomask 2. The second photoresist patterns 46 and the photoresist parasitic patterns 49 may be formed on the lower step 38 of the semiconductor substrate 30 corresponding to the second mask patterns 20 of the photomask 2. On analysis of the formation of the patterns 43, 46, and 49, the aerial images of FIGS. 6 and 7 may have a small DOF and be formed on the photoresist layer 40.

If the photolithography process is in a slightly unstable environment, the aerial images of FIGS. 6 and 7 may become sources that lead to formation of the first and second photoresist patterns 43 and 46 and the photoresist parasitic patterns 49 on the semiconductor substrate 30. The second photoresist patterns 46 and the photoresist parasitic patterns 49 may be shown in FIG. 10. In another case, the aerial images of FIG. 8 may have a large DOF than the arial images of FIGS. 6 and 7, and be formed on the photoresist layer 40.

Even if the photolithography process is unstable, the aerial images of FIG. 8 may become sources that lead to stable formation of the first and second photoresist patterns 43 and 46 on the semiconductor substrate 30. The second photoresist patterns 46 may be shown in FIG. 9. Thus, the first and second photoresist patterns 43 and 46 may respectively have the substantially same pitches P and W1+S1 as the first and second mask patterns 10 and 20 of the photomask 2.

As described above, example embodiments provide a photomask for transferring mask patterns onto a semiconductor substrate having a step difference. Due to concave and convex portions formed in lateral portions of the mask patterns, the area of a unit exposure region 80 disposed between the mask patterns as shown in FIG. 5 can be increased more than in the conventional art. Thus, the photomask can transfer aerial images of the mask patterns onto the semiconductor substrate better than in conventional methods. As a consequence, the photomask can increase the DOF of the mask patterns during an exposure process, thereby stabilizing an environment of a photolithography process. Also, the photomask can increase a process margin in methods of fabricating semiconductor devices.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A photomask to be transferred using a dipole illumination system onto a semiconductor substrate having upper and lower steps disposed at different heights, the photomask comprising: first and second mask patterns disposed adjacent to each other, the second mask patterns having first and second concave and convex portions repetitively and alternately disposed along opposite facing lateral portions of the second mask patterns, wherein the opposite facing lateral portions are perpendicular to an extension line connecting centers of openings in the dipole illumination system, and wherein the second mask patterns have different widths from each other,
wherein the second mask patterns on the photomask correspond to the lower step on the semiconductor substrate.

2. The photomask of claim 1, wherein either of the first concave portions or the first convex portions are aligned with either of the second concave portions or the second convex portions.

3. The photomask of claim 2, wherein the first and second mask patterns have the second and first concave and convex portions disposed on opposite sides of the opposite facing lateral portions of the second mask patterns.

4. The photomask of claim 1, wherein the first concave and convex portions are aligned with the second convex and concave portions, respectively.

5. A photomask to be transferred using a dipole illumination system onto a semiconductor substrate having upper and lower steps disposed at different heights, the photomask comprising: first and second mask patterns, the second mask patterns having first and second concave and convex portions repetitively and alternately disposed along opposite facing lateral portions, which are perpendicular to an extension line connecting centers of openings in the dipole illumination system, and wherein the second mask patterns have different widths from each other,
wherein the second mask patterns are disposed on the photomask to correspond with the lower step on the semiconductor substrate, wherein the first concave and convex portions are repetitively and alternately disposed along both opposite lateral portions of the first mask pattern, and wherein the second concave and convex portions are repetitively and alternately disposed along both opposite facing lateral portions of the second mask patterns.

6. The photomask of claim 5, wherein either of the first concave portions or the first convex portions are aligned with either of the second concave portions or the second convex portions.

7. The photomask of claim 5, wherein the first concave and convex portions are aligned with the second convex and concave portions, respectively.

8. A photomask for a semiconductor substrate having upper and lower steps disposed at different heights, the photomask comprising:
a first region having a first mask pattern on a photomask substrate, the first mask pattern having at least two line patterns being spaced apart from and in parallel with each other; and
a second region having a second mask pattern on the photomask substrate, the second mask pattern having two parallel and adjacent line patterns with different widths from each other, and with a first side and a second side facing opposite to each other;
wherein the first side of the second mask pattern has first concave portions and first convex portions repeating along the first side; and
wherein the first region corresponds to the upper step of the semiconductor substrate and the second region corresponds to the lower step of the semiconductor substrate.

9. The photomask of claim 8, wherein the second side of the second mask pattern has second concave portions and second convex portions repeating along the second side.

10. The photomask of claim 9, wherein the first concave portions are aligned with the second convex portions and the second concave portions are aligned with the first convex portions.

11. The photomask of claim 8, wherein the phomomask is used in a dipole illumination system having two openings of the dipole illumination system, the first concave portions and the first convex portions are perpendicular to an extension line connecting centers of the two openings.

* * * * *